(12) United States Patent
Leman (10) Patent No.: US 6,261,104 B1
(45) Date of Patent: Jul. 17, 2001

(54) RISER CARD ASSEMBLY AND METHOD FOR ITS INSTALLATION

(75) Inventor: Michael V. Leman, Eagle, ID (US)

(73) Assignee: Micron Electronics, Inc., Nampa, ID (US)

(*) Notice: Subject to any disclaimer, the term of this patent is extended or adjusted under 35 U.S.C. 154(b) by 0 days.

(21) Appl. No.: 09/375,157

(22) Filed: Aug. 16, 1999

(51) Int. Cl.[7] .................................................. H01R 12/00
(52) U.S. Cl. ............................................. 439/61; 439/752
(58) Field of Search ................................. 439/61, 62, 64, 439/77, 67; 361/752, 784, 788, 785, 790, 792

(56) References Cited

U.S. PATENT DOCUMENTS

| | | | |
|---|---|---|---|
| 4,237,546 | * | 12/1980 | Wells ..................................... 361/788 |
| 4,498,717 | * | 2/1985 | Reimer ................................... 439/62 |
| 5,259,784 | * | 11/1993 | Iwatare et al. ........................ 361/788 |
| 5,536,176 | * | 7/1996 | Borchew et al. ..................... 361/788 |
| 5,648,891 | * | 7/1997 | Gierut ................................... 439/62 |
| 5,692,043 | * | 11/1997 | Gliga et al. ........................... 439/61 |
| 5,740,020 | * | 4/1998 | Palatov ................................. 361/788 |
| 5,808,867 | * | 9/1998 | Wang .................................... 361/695 |
| 6,004,139 | * | 12/1999 | Dramstad et al. .................... 439/61 |
| 6,075,704 | * | 6/2000 | Amberg et al. ...................... 361/792 |

* cited by examiner

Primary Examiner—Tulsidas Patel
(74) Attorney, Agent, or Firm—Perkins Coie LLP (57) ABSTRACT

A method and apparatus for expanding the circuitry of a circuit board, such as a computer motherboard. The apparatus can include a riser card removably coupled to the circuit board and having a plurality of expansion slots for receiving expansion devices. The riser card can include a connector for receiving a second riser card having further expansion slots for removably receiving additional expansion devices. Accordingly, a single riser card can be connected to a circuit board that is installed in a chassis that can accept no more than one riser card, and a pair of such riser cards can be stacked, one upon the other, on a circuit board that is installed in a chassis that can accommodate stacked riser cards.

15 Claims, 6 Drawing Sheets

RISER CARD ASSEMBLY AND METHOD FOR ITS INSTALLATION

TECHNICAL FIELD

The present invention relates to riser card assemblies for electronic devices, such as computers, and methods for their installation.

BACKGROUND OF THE INVENTION

Conventional computers typically include a chassis that encloses circuit components, such as processors, memory chips, peripheral interface devices and other circuit elements. The core circuit components, such as the processor and the memory chips, are often mounted on a single printed circuit board, such as a motherboard. It is often desirable to provide the computer with expansion ports or slots for attaching additional printed circuit cards ("expansion cards") having additional circuit elements. In this manner, a user or manufacturer can add additional capabilities and/or functions to the computer without significantly altering the existing computer structure. In one conventional arrangement, the expansion slots are provided on the motherboard. One drawback with this approach is that the expansion slots take up valuable space on the motherboard. One approach to addressing this drawback is to attach an intermediate riser card to a single slot of the motherboard and attach a plurality of expansion cards to the riser card. Accordingly, a plurality of expansion cards can be coupled to the motherboard via the riser card in an arrangement that occupies only a single slot on the motherboard.

Conventional computer chassis and motherboards come in a variety of shapes and sizes. For example, some "full-form" conventional desktop computer chassis and tower chassis are dimensioned such that a single riser card, attached to the motherboard, can have six or seven expansion slots to accommodate expansion cards. A new type of "low-profile" chassis takes up less space than the conventional full-form chassis, but the low-profile has a limited height that cannot accommodate a riser card having six or more expansion slots. For example, in one low-profile configuration with an NLX motherboard that slides into the chassis, a riser card is attached directly to a low-profile chassis and the motherboard is coupled to one slot of the riser card. The low-profile riser card can include up to three additional expansion slots that each accommodate one expansion card. One drawback with this arrangement is that a different riser card may be required for low-profile and full-form chassis, and still a different riser card may be required for ATX or NLX motherboards. Accordingly, computer manufacturers and suppliers may be required to provide and maintain an inventory of several types of riser cards, which can be expensive and inefficient.

SUMMARY OF THE INVENTION

The present invention is directed to riser cards for expanding the circuitry of a device such as a computer. In one aspect of the invention, the riser card can include a generally flat support member having a first connector for coupling to a circuit board (such as a motherboard) of a computer, a second connector for coupling to another riser card, a plurality of expansion ports for coupling to expansion devices, and coupling circuitry coupled to the first connector and the expansion ports. In a further aspect of the invention, like riser cards can be stacked one upon the other to increase the number of expansion ports coupled to the circuit board. Alternatively, the stacked riser cards can be different. For example, the lower riser card can include a connector for coupling to the circuit board and can include pass-through circuitry for coupling to the upper riser card. The upper riser card can include a connector for connecting to the lower riser card and need not include pass-through circuitry.

The riser card connectors can include one or more of several different types. For example, where the circuit board is a motherboard, the riser card can include a connector that is removably received by a corresponding connector of a motherboard. In one embodiment, the motherboard can be attached to a computer chassis and the riser card can be removably coupled to the motherboard. In another embodiment, the riser card can be attached to the chassis and the motherboard can be removably coupled to the riser card. The connectors can include edge connectors that face toward or perpendicular to the motherboard or alternatively, the connectors can be coupled to a ribbon cable extending between the riser cards.

The present invention is also directed to methods for expanding the circuitry of a circuit board by coupling one or more riser cards to the circuit board. In one aspect of the invention, the method can include removably coupling a first riser card to a connector of the circuit board, removably coupling a second riser card to the first riser card, and removably connecting at least one selected circuit device to one of the first and second riser cards. The method can further include passing electrical signals directly from the second riser card to the circuit board via the first riser card.

In another aspect of the invention, the same type of riser card can be used for several different types of computers. For example, the method can include coupling a first riser card to a site of a first circuit board of a first type of computer where the site is configured to accommodate at most a single riser card. The method can further include coupling a second riser card of the same type as the first riser card to a site of a second circuit board of a second type of computer. The method can still further include coupling to the second riser card a third riser card such that each of the riser cards has an expansion port accessible for connecting to a selected device.

DETAILED DESCRIPTION OF THE INVENTION

The present invention is directed toward methods and apparatuses for expanding the circuitry of electronic devices, such as computers. The apparatus can include a modular riser card that can be installed singly in a low-profile computer chassis, or can be stacked on another riser card in a tower chassis or a larger desktop computer chassis. Many specific details of certain embodiments of the invention are set forth in the following description and in FIGS. 1–6 to provide a thorough understanding of such embodiments. One skilled in the art, however, will understand that the present invention may have additional embodiments and that they may be practiced without several of the details described in the following description.

Figure 1:
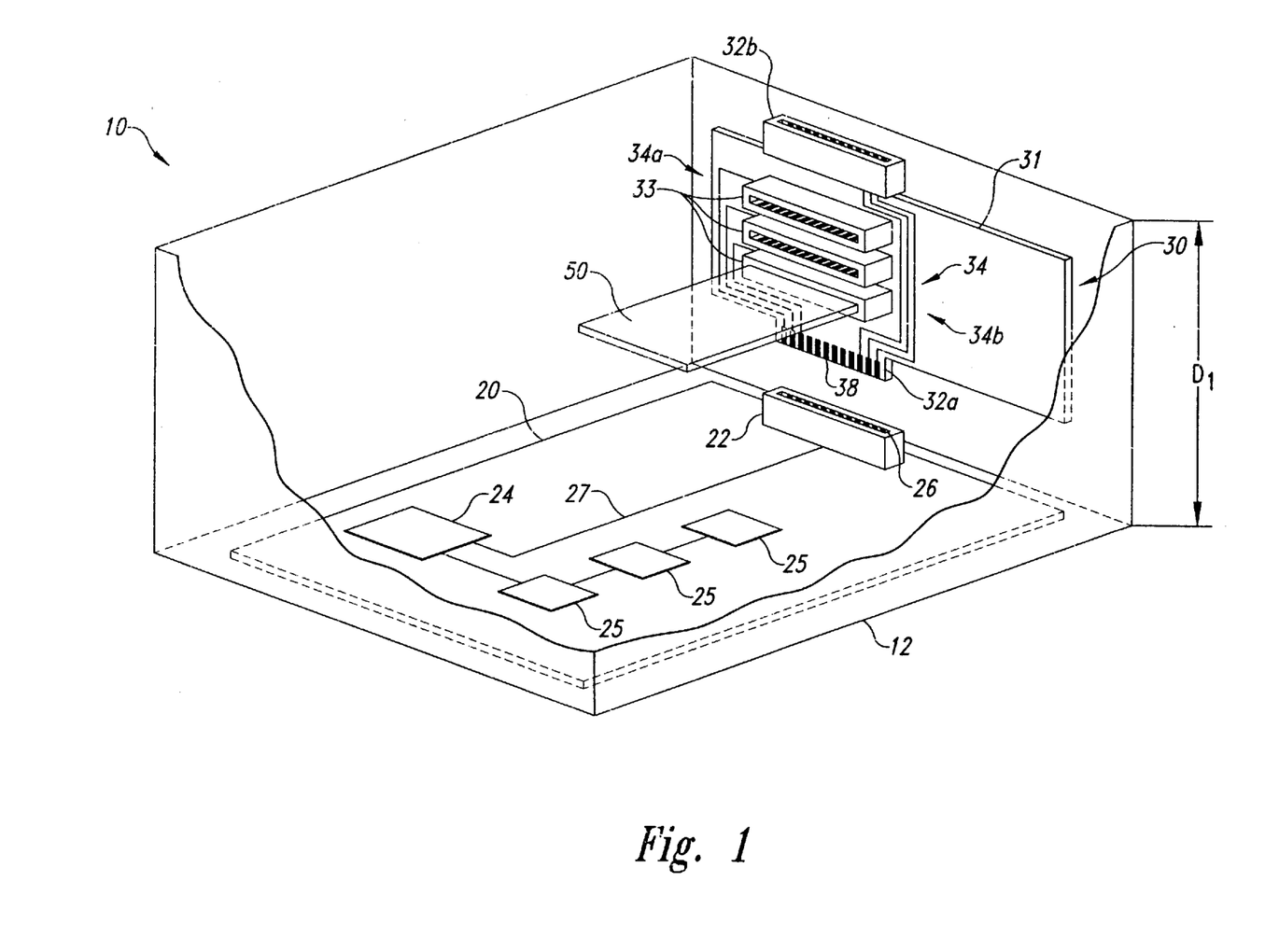
FIG. 1 is a partially schematic, cutaway top isometric view of a computer chassis having a motherboard and a riser card in accordance with an embodiment of the invention.

FIG. 1 is a top isometric view of a portion of a computer 10 having a chassis 12 that houses a motherboard 20 in accordance with an embodiment of the invention. The chassis 12 can also house other components which are not shown in FIG. 1 for purposes of clarity. The motherboard 20 can include circuit elements, such as a processor 24, memory devices 25 and connecting circuitry 27 (shown schematically in FIG. 1). The motherboard 20 can also include a motherboard connector 22 having a plurality of electrical contacts for coupling other devices to the motherboard 20. For example, in one embodiment the motherboard connector 22 can be an edge connector having a socket or slot 26 with a plurality of electrical contacts that engage corresponding electrical contacts of a riser card 30 when the riser card 30 is inserted into the slot 26. In other embodiments, the motherboard connector 22 can have other configurations.

The riser card 30 can include a support member 31 and two riser connectors 32 (shown as a lower riser connector 32a and an upper riser connector 32b) attached to the support member 31. In one embodiment, the support member 31 can include a printed circuit board, and in other embodiments, the support member 31 can include other generally rigid structures configured to support other devices, as will be discussed in greater detail below.

The lower riser connector 32a can be removably coupled to the motherboard connector 22. For example, where the motherboard connector 22 includes a slot 26, the lower riser connector 32a can be an edge connector having a tab that is removably received in the slot 26. The lower riser connector 32a can further include electrical contacts 38 that are removably coupled to corresponding electrical contacts of the motherboard connector 22 when the lower riser connector 32a is received in the slot 26. The upper riser connector 32b can include a slot generally similar to the slot 26 of the motherboard connector 22 to receive the lower riser connector 32a of another riser card, as will be discussed in greater detail below with reference to FIG. 2.

The riser card 30 shown in FIG. 1 can also include a plurality of expansion ports 33 electrically coupled to the lower riser connector 32a. In one embodiment, the expansion ports 33 can include slotted connectors, and in other embodiments the expansion ports 33 can include other types of electrical connectors. In any case, the riser card 30 can include three expansion ports 33 (as shown in FIG. 1), or the riser card 30 can include more or fewer expansion ports 33. For example, where the riser card 30 includes more than four expansion ports 33, the riser card 30 can include one or more bridge chips, such as are commercially available, to support the additional expansion ports 33. The expansion ports 33 can be positioned in one or both of the oppositely facing planar surfaces of the support member 31.

Each expansion port 33 can be configured to removably receive an expansion device 50. In one embodiment, the expansion device 50 can include a printed circuit board having circuit elements that are coupled to the motherboard 20 via the riser card 30. For example, the expansion device 50 can include a video card, a modem card, a network card or another type of card. Alternatively, the expansion devise 50 can include any device that is compatible with the motherboard 20.

The riser card 30 can also include coupling circuitry 34 (shown schematically in FIG. 1). The coupling circuitry 34 can include connecting leads 34a that connect the expansion ports 33 to the lower riser connector 32a. The coupling circuitry 34 can also include pass-through circuitry 34b that extends between the lower riser connector 32a and the upper riser connector 32b. As will be discussed in greater detail below with reference to FIG. 2, the pass-through circuitry 34b is generally not coupled to the expansion ports 33, but rather transmits electrical signals directly between the two riser connectors 32.

Figure 2:
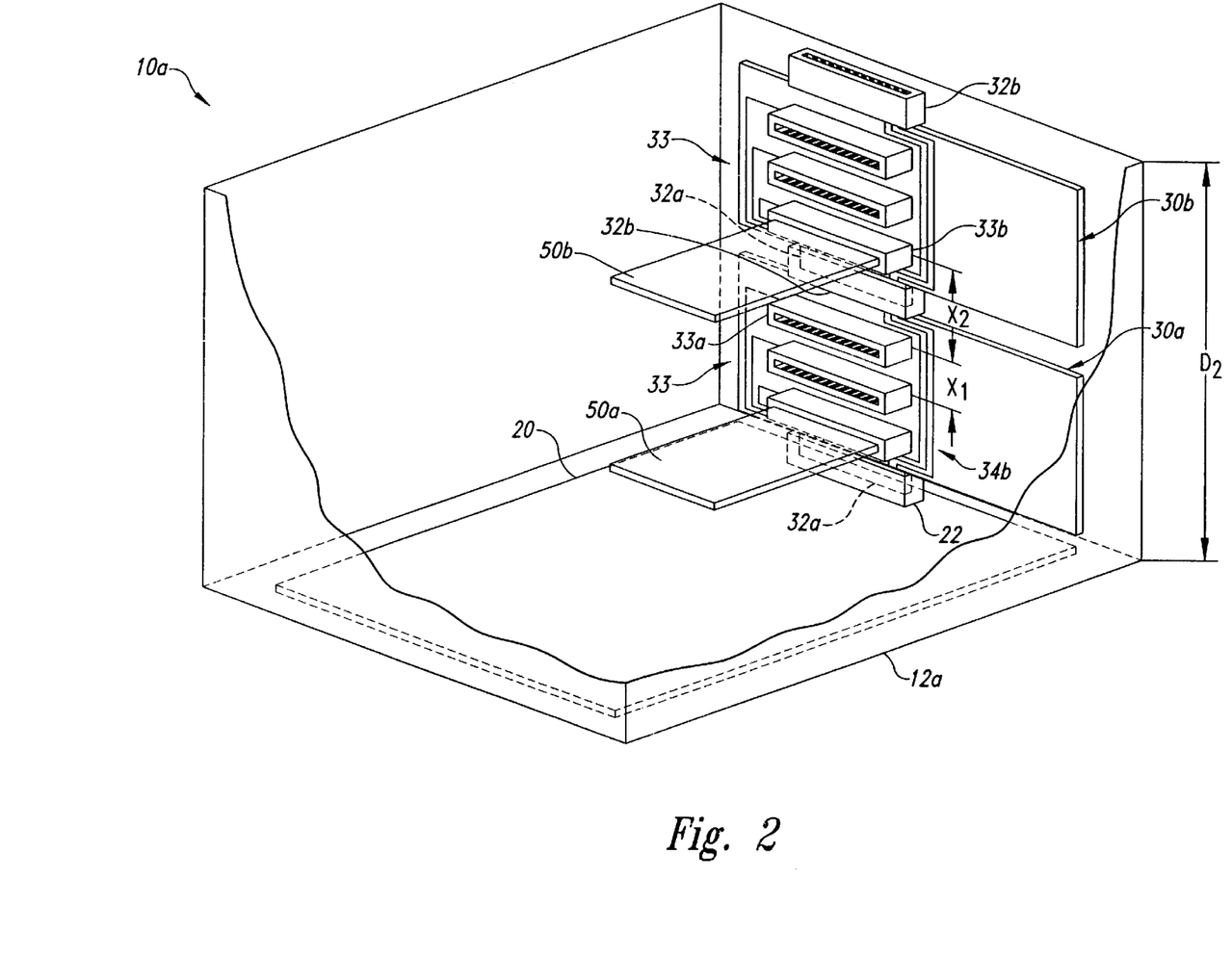
FIG. 2 is a cutaway top isometric view of a computer chassis having a motherboard and a pair of riser cards in accordance with another embodiment of the invention.

The computer chassis 12 shown in FIG. 1 is a low-profile chassis having a depth $D_1$ that can accommodate a single riser card 30. Accordingly, up to three expansion devices 50 can be electrically coupled to the motherboard 20 via the single riser card 30. FIG. 2 is a top isometric view of a full-form computer 10a having a chassis 12a with a depth $D_2$ that can accommodate a plurality of riser cards 30. For example, the chassis 12a can accommodate two stacked riser cards 30, shown as a lower riser card 30a coupled to the motherboard 20 and an upper riser card 30b coupled to the lower riser card 30a. The lower riser card 30a can be connected to the motherboard 20 in a manner similar to that discussed above with reference to FIG. 1.

In one embodiment, the upper riser card 30b can be configured identically to the lower riser card 30a. Accordingly, the upper riser card 30b can include a lower riser connector 32a that is removably attached to the upper riser connector 32b of the lower riser card 30a. In this manner, the upper riser card 30b can be both physically and electrically coupled to the lower riser card 30a in a stacked configuration. As a result, the combination of riser cards 30 can provide six expansion ports 33 to accommodate up to six expansion devices 50, two of which are shown in FIG. 2 as a lower expansion device 50a and an upper expansion device 50b. In another embodiment, where the depth $D_2$ of the chassis 12a is greater than that shown in FIG. 2, additional riser cards 30 can be coupled to the upper riser card 30b to provide for an even greater number of expansion ports 33.

In one embodiment, the upper expansion devices 50b are electrically coupled to the motherboard 20 via the pass-through circuitry 34b on the lower riser card 30a. As discussed above with reference to FIG. 1, the pass-through circuitry 34b can connect the upper and lower riser connectors 32 of the lower riser card 30a without connecting directly to the expansion ports 33 of the lower riser card 30a. Accordingly, the pass-through circuitry 34b can provide a direct link between the motherboard 20 and the upper expansion devices 50b without directly coupling the upper expansion devices 50b to the lower expansion devices 50a. In one aspect of this embodiment, all the expansion devices 50 may still communicate with each other indirectly via the motherboard 20.

The expansion ports 33 on each of the riser cards 30 are separated by a distance $X_1$, and the uppermost expansion port 33a of the lower riser card 30a is separated from the lowermost expansion port 33b of the upper riser card 30b by a distance $X_2$. In one embodiment, the distances $X_1$ and $X_2$ are approximately equal so that adjacent expansion ports 33 are separated by approximately the same distance, regardless of which riser card they are attached to. For example, the expansion ports 33 can be spaced apart by approximately 0.8 inches. An advantage of this arrangement is that it may be possible to more efficiently fill a given vertical distance with expansion ports. In one aspect of this embodiment, the expansion ports 33 can be offset laterally from an axis extending between lower riser connector 32a and the upper riser connector 32b, as shown and discussed in greater detail below with reference to FIG. 4. A further advantage of laterally offsetting the expansion ports 33 is that it may be easier to separate all the expansion ports 33 by the same distance where the vertical positions of the expansion ports 33 are not constrained by the positions of the riser connectors 32.

In an alternate arrangement, the distance $X_1$ can be different than the distance $X_2$. For example, the distance $X_2$ can be greater than $X_1$. An advantage of this arrangement is that expansion devices 50 requiring additional vertical space can be accommodated in expansion ports separated by the distance $X_2$ and expansion devices 50 requiring less vertical space can be accommodated in expansion ports separated by the distance $X_1$.

In another embodiment, the distances $X_1$ and $X_2$ between the expansion devices 50, as well as the distance between the riser cards 30 and other components on the motherboard 20 can be selected so as not to exceed the critical path length between components. For example, it may be important in some cases to position an expansion device 50, such as a video card, a selected distance (as measured along an electrical path) from other devices, such as the processor 24 (FIG. 1). This can be accomplished by positioning the motherboard connector 22 a selected distance from the processor 24 and/or by selecting the distances $X_1$ and $X_2$ (or the particular expansion port 33 to which the expansion device 50 is connected) to place the expansion device 50 at the desired location.

In one embodiment, the riser cards 30 can include a termination circuit, for example, an RC circuit mounted to a printed circuit board that connects to the upper riser connector 32b of the upper riser card 30b (or the upper riser connector 32b of the lower riser card 30a where the upper riser card 30b is not present; see FIG. 1). The purpose of the termination circuit is to prevent signal reflections at the unconnected upper riser connector 32b.

One feature of the riser cards 30 shown in FIGS. 1 and 2 is that a single type of riser card 30 can be installed in a variety of types of computer chassis. For example, one riser card 30 of the type discussed above can be positioned in a low-profile or other relatively small chassis, such as the chassis 12 shown in FIG. 1, to provide the computer 10 with a selected number of expansion ports 33. A plurality of the same type of riser cards 30 can be positioned in a full-form or other larger chassis, such as the chassis 12a shown in FIG. 2, to provide an increased number of expansion ports. Accordingly, the same type of riser card can be installed in a number of different types of chassis to provide each type of chassis with a selected number of expansion ports 33. An advantage of this feature is that manufacturers need only produce a single type of riser card 30, and distributors need only inventory a single type of riser card 30 to be compatible with several types of computer chassis.

Figure 3:
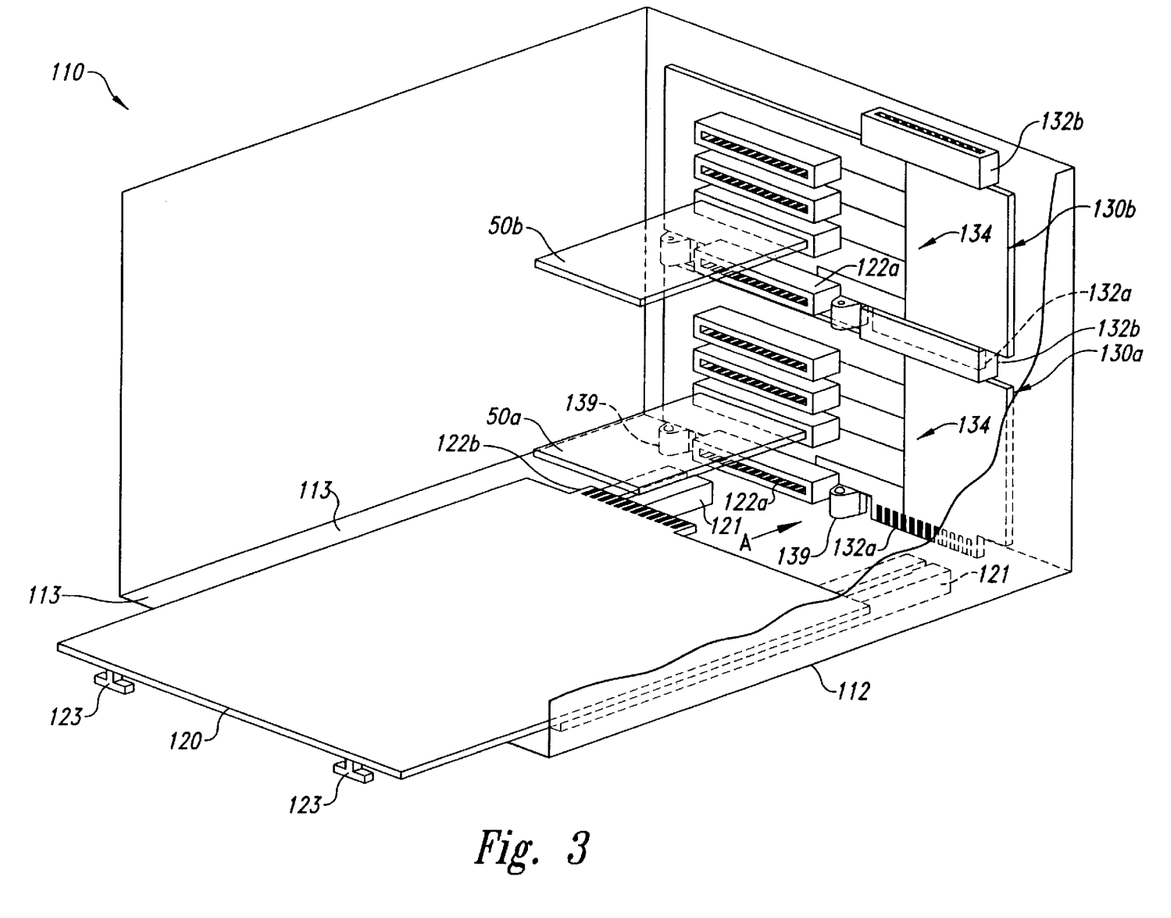
FIG. 3 is a cutaway top isometric view of a computer chassis having a motherboard and a pair of riser cards in accordance with yet another embodiment of the invention.

FIG. 3 is a partially schematic, top isometric view of a computer 110 that includes a computer chassis 112, a motherboard 120, and riser cards 130 (shown as a lower riser card 130a and an upper riser card 130b) in accordance with another embodiment of the invention. In one aspect of this embodiment, the lower rise card 130a is attached directly to a lower surface 113 of the chassis 112, and the motherboard 120 is slidably attached to the lower riser card 130a and the lower surface 113. For example, the lower riser card 130a can include two bosses 139 that are bolted to the chassis 112. Alternatively, the lower riser card 130a can be attached to the chassis 112 with other types of fasteners. In any case, the lower riser card 130a can include a first motherboard connector 122a (for example, a socket) configured to couple to a second motherboard connector 122b (for example, a tab) on the motherboard 120.

The second motherboard connector 122b is slidably and removably received by the first motherboard connector 122a of the lower riser card 130a as the motherboard 120 is moved toward the lower riser card 130a (indicated by arrow "A"). Accordingly, the motherboard 120 can be selectively engaged or disengaged with the lower riser card 130a by moving the motherboard 120 in a direction generally perpendicular to the plane of the first riser card 130a. An advantage of this arrangement is that the motherboard 120 can be removed from the chassis 112 without removing the lower riser card 130a.

The motherboard 120 can include guide members 123 that slidably and removably engage corresponding slotted guide rails 121 positioned on the lower surface 113 of the chassis 112. The guide members 123 and guide rails 121 guide the motherboard 120 as it moves toward the lower riser card 130a. In one embodiment, the motherboard 120 can be an NLX type motherboard, and the chassis 112 can be an NLX type chassis, both in accordance with NLX specifications from Intel Corporation of Santa Clara, Calif. Alternatively, the motherboard 120 and the chassis 112 can have other configurations that allow the motherboard to be removably attached to the chassis 112.

The lower riser card 130a can further include a lower riser connector 132a that remains unconnected when the lower riser card 130a is attached directly to the chassis 112. In one aspect of this embodiment, the lower riser connector 132a can be configured to couple with a motherboard connector 22 of the type shown in FIG. 1. Accordingly, the same lower riser card 130a can be connected to a motherboard 20 of the type shown in FIG. 1, or to a motherboard 120 of the type shown in FIG. 3, further increasing the modularity of the riser cards 130.

The lower riser card 130a can include an upper riser connector 132b configured to receive a corresponding lower riser connector 132a of the upper riser card 130b when the two riser cards are stacked (shown in FIG. 3). The first motherboard connector 122a and the upper riser connector 132b of the upper riser card 130b remain unconnected when the upper riser card 130b is coupled to the lower riser card 130a in a stacked configuration with only two riser cards. Accordingly, although certain features of each riser card 130 may not be utilized (depending upon whether the riser card 130 is attached directly to the chassis 112 or attached to another riser card 130), the upper and lower riser cards 130a and 130b can be identical, eliminating the need to manufacture and inventory a store of separate riser cards for different computer chassis.

In one embodiment, each riser card 130 can include a bus 134, shown schematically in FIG. 3. The bus 134 can be coupled to the upper and lower connectors 132a, 132b of each riser card 130, and can also be coupled to the first motherboard connector 122a and expansion ports 133 of each riser card 130. Accordingly, expansion devices 50a and 50b coupled to either riser card 130 can communicate via the bus 134 with any other expansion device 50, regardless of whether the other expansion devices 50 are coupled to the lower riser card 130a or the upper riser card 130b.

Figure 4:
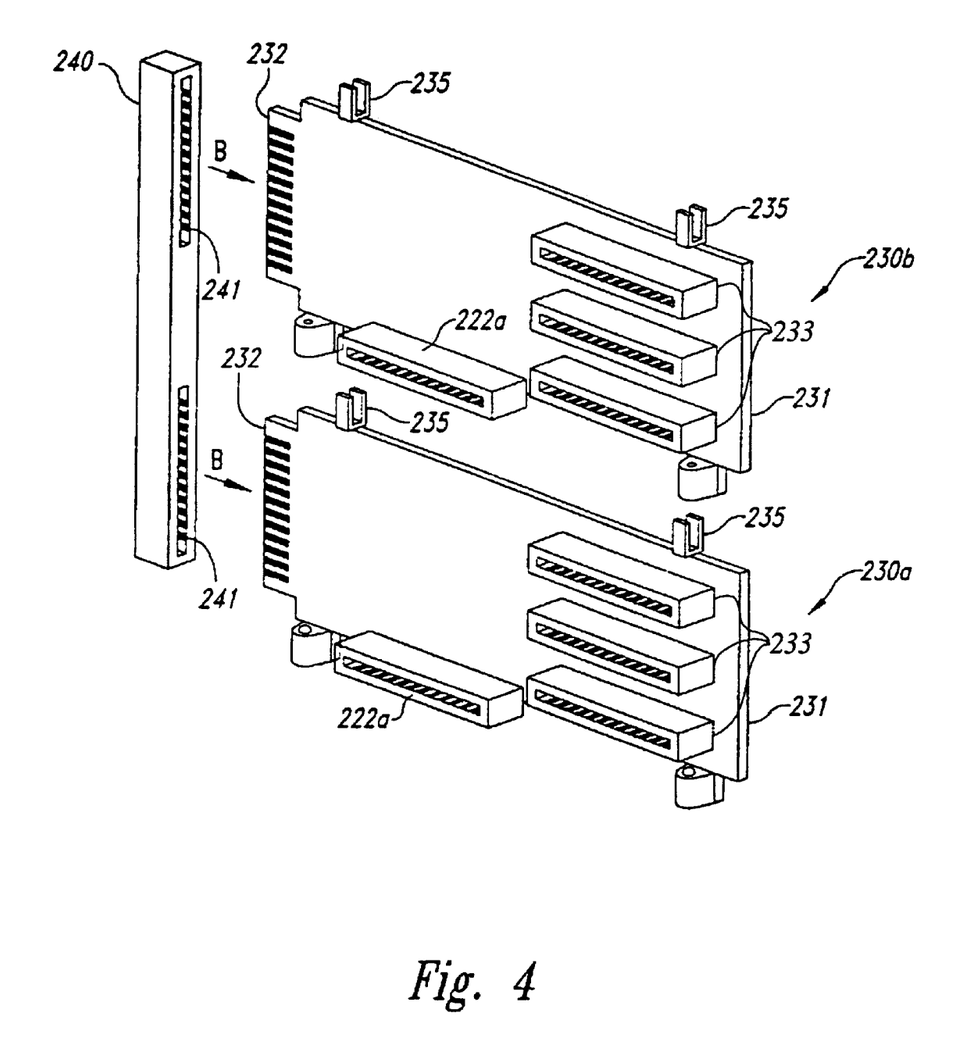
FIG. 4 is a side isometric view of a pair of riser cards coupled with an edge connector in accordance with an embodiment of the invention.

FIG. 4 is a side isometric view of two riser cards 230 (shown as a lower riser card 230a and an upper riser card 230b) coupled at the sides of the riser cards with a riser coupler 240 in accordance with another embodiment of the invention. In one embodiment, each riser card 230 can include a support member 231 having a side-mounted riser connector 232 projecting from an edge of the riser card that is generally perpendicular to the motherboard 120 (FIG. 3). In one aspect of this embodiment, the riser connector 232 can include a tab with electrical contacts. The riser coupler 240 can have two slots 241, each having corresponding electrical contacts configured to engage the electrical contacts of one of the riser connectors 232 when the riser coupler 240 is moved toward the connectors 232 (shown by arrows "B"). Accordingly, the riser coupler 240 can provide both a physical and an electrical connection between the two riser cards 230. Alternatively, the riser coupler 240 and the riser connectors 232 can have other configurations that physically and electrically couple the riser cards 230.

In one embodiment, the riser coupler 240 alone can adequately support the upper riser card 230b in position above the lower riser card 230a. In another embodiment, the riser cards 230 can be configured to provide additional support to the upper riser card 230b. For example, the lower riser card 230a can include clips 235 that hold the support member 231 of the upper riser card 230b. Alternatively, the clips 235 can engage the first motherboard connector 222a of the upper riser card 230b, or the riser cards 230 can be coupled with other releasable fasteners. In the embodiment shown in FIG. 4, both the lower riser card 230a and the upper riser card 230b can include clips 235 to provide for increased commonality, even though only the clips 235 of the lower riser card 230a may be utilized. Alternatively, the clips 235 of the upper riser card 230b can be eliminated.

Another feature of the riser cards 230 shown in FIG. 4 is that they can include adjacent expansion ports 233 that are equally spaced, regardless of which riser card they are attached to. The expansion ports 233 can be laterally offset from the first motherboard connectors 225a so that the vertical position of the expansion ports is not constrained by the position of the motherboard connector 222a. As was discussed above with reference to FIG. 2, the expansion ports can also be offset where the riser card includes aligned riser connectors, such as the lower riser connector 32a and the upper riser connector 32b shown in FIG. 2.

Figure 5:
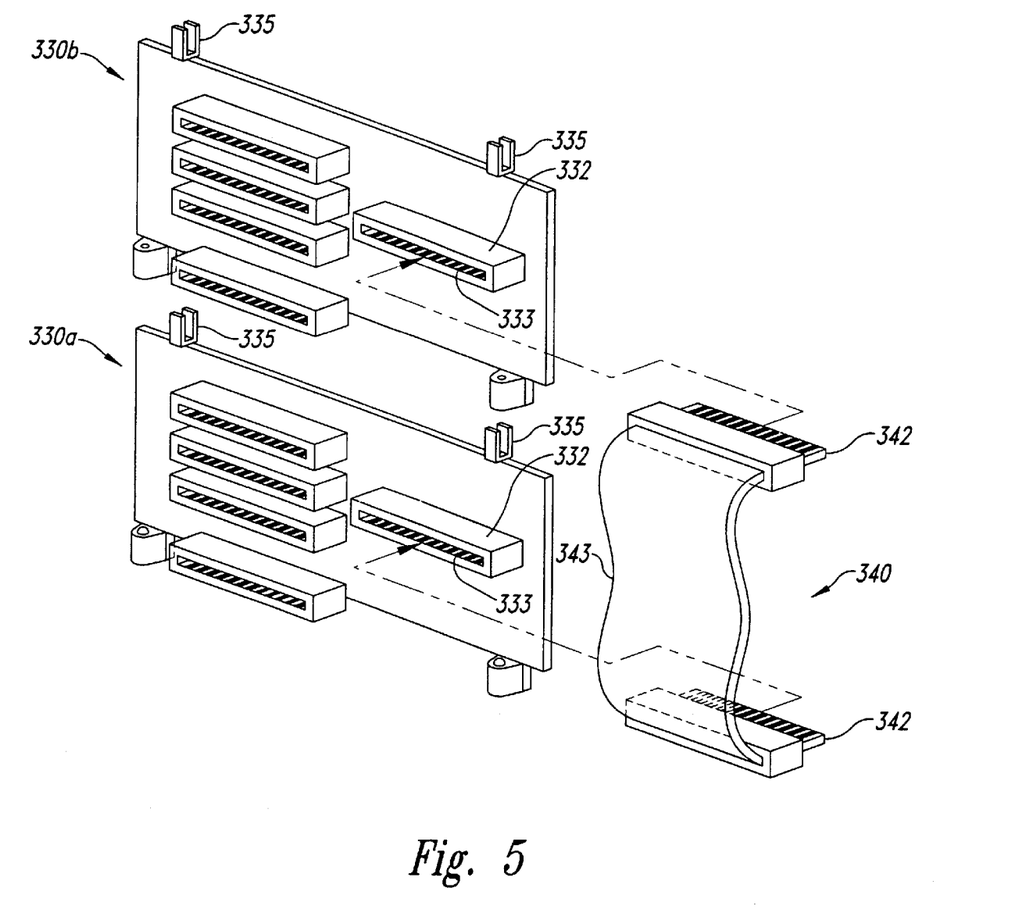
FIG. 5 is a side isometric view of a pair of riser cards coupled with a ribbon cable in accordance with another embodiment of the invention.

FIG. 5 is a side isometric view of two riser cards 330 (shown as a lower riser card 330a and an upper riser card 330b) coupled with a ribbon coupler 340 in accordance with another embodiment of the invention. In one aspect of this embodiment, the ribbon coupler 340 can include a ribbon cable 343 having a ribbon connector 342 at each end. Each riser card 330 can include a riser connector 332 having a slot 333 configured to removably receive one of the connectors 342 of the ribbon coupler 340. As discussed above with reference to FIG. 5, each riser card 330 can include one or more clips 335 configured to hold an upper riser card. As was also discussed above with reference to FIG. 5, the riser cards 330 can include other fasteners to support the upper riser card 330b relative to the lower riser card 330a.

Figure 6:
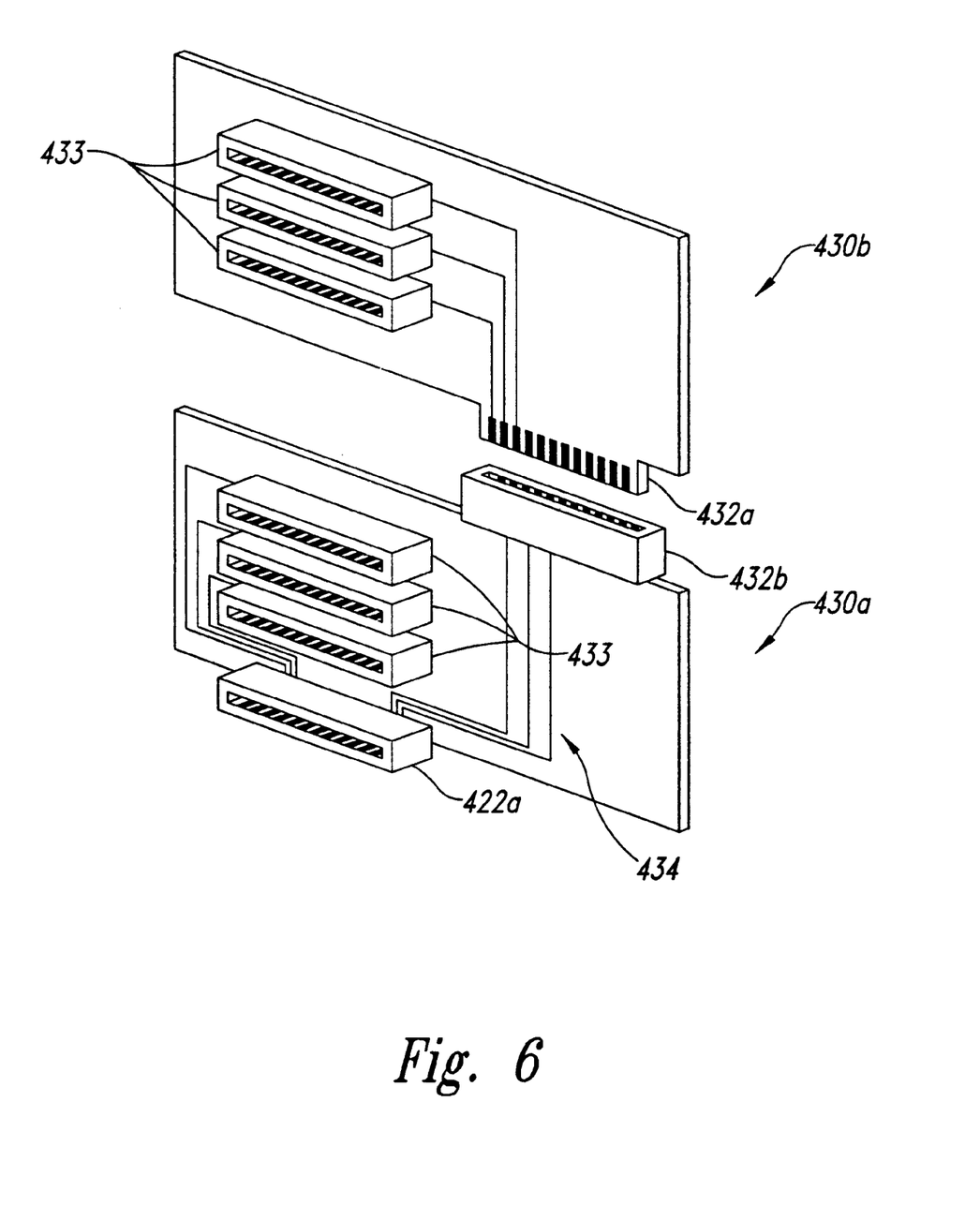
FIG. 6 is a side isometric view of pair of riser cards, each having a different configuration in accordance with still another embodiment of the invention.

FIG. 6 is a side isometric view of two riser cards 430 (shown as a lower riser card 430a and an upper riser card 430b) that have different configurations in accordance with still another embodiment of the invention. For example, the lower riser card 430a can include a first motherboard connector 422a for coupling to the second motherboard connector 122b shown in FIG. 3. The lower riser card 430a can also include an upper riser connector 432b coupled with pass-through circuitry 434 to the first motherboard connector 422a. The upper riser card 430b can include a lower riser connector 432a which, in one embodiment, can include a tab portion that is removably received by a corresponding slot of the upper riser connector 432a of the lower riser card 430a. In one aspect of the embodiment shown in FIG. 6, the lower riser connector 432a of the upper riser card 430b can face downward and the upper riser connector 432b of the lower riser card 430a can face upward. Accordingly, the upper and lower riser cards 430 can be joined by moving the riser cards 430 toward each other in the plane of the riser cards 430. In an alternate arrangement (not shown), the riser connectors 432 can face generally horizontally and can be connected toy moving the riser cards together in a direction generally perpendicular to the plane of the riser cards. In other embodiments, the riser cards 430 can be connected by moving them together in other directions. In any case, each riser card 430 can include a plurality of expansion ports 433 to accommodate one or more of the expansion devices 50 (FIG. 1).

One feature of the arrangement shown in FIG. 6 is that the riser cards 430a and 430b include features that correspond to the position of the riser card with respect to the motherboard. For example, the lower riser card 430a includes a first motherboard connector 422a and an upper riser connector 432b, but does not include a lower riser connector 432a. Furthermore, the upper riser card 430b includes a lower riser connector 432a for coupling to the lower riser card 430a, but does not include a first motherboard connector 422a, an upper riser connector 432b, or pass-through circuitry 434 because these features are not required for a riser card in the upper position. An advantage of this arrangement is that the riser cards need not include features or elements that will not be used once the riser card is placed in a selected position. Conversely, an advantage of the riser cards discussed above with reference to FIGS. 1–5 is that the upper and lower riser cards can be interchangeable.

From the foregoing it will be appreciated that, although specific embodiments of the invention have been described herein for purposes of illustration, various modifications may be made without deviating from the spirit and scope of the invention. For example, the riser cards were described above in the context of computer chassis, for purposes of illustration. The same or similar riser cards can also be installed in other electronic devices, such as instrumentation equipment, telecommunication equipment or other devices where modular riser cards are suitable. Furthermore, the features of individual embodiments of the riser cards shown in the figures need not be limited to these embodiments. For example, any of the riser cards can include a bus or pass-through circuitry. Accordingly, the invention is not limited except as by the appended claims.

What is claimed is:

1. A computer assembly, comprising:
   a chassis having a base surface and a plurality of sidewall surfaces depending from the base surface, the base surface including at least one slotted guide channel;
   a first riser card attached directly to the base surface of the chassis and having a first printed circuit board with a first motherboard connector, a first riser connector and a second riser connector, the first riser card further having a first plurality of expansion ports and first coupling circuitry connected to the first plurality of expansion ports and the first and second riser connectors;

a motherboard positioned generally parallel to the base surface and generally perpendicular to the first riser card, the motherboard having at least one of a processor device and a memory device, the motherboard further having a second motherboard connector electrically connected to the first motherboard connector of the first riser card, the motherboard still further having at least one guide member releasably engaged with the slotted guide channel of the chassis to resist relative motion between the motherboard and the chassis; and a second riser card configured to be interchangeable with the first riser card and having a second printed circuit board with a third motherboard connector, a third riser connector and a fourth riser connector, the third riser connector of the second riser card being engaged with and electrically connected to the second riser connector of the first riser card to support the second riser card in a position spaced apart from the motherboard and co-planer with the first riser card, the second riser card further having a second plurality of expansion ports and second coupling circuitry connected to the second plurality of expansion ports and the third and fourth riser connectors, each of the expansion ports defining the first and second plurality of expansion ports being configured to engage and electrically couple to a printed circuit board of a selected device and support the printed circuit board of the selected device in a spaced apart position generally parallel to the motherboard and perpendicular to the one of the first and second riser cards with which the printed circuit board of the selected device is engaged.

2. The computer assembly of claim 1 wherein the first printed circuit board defines a generally flat plane and the first motherboard connector includes a first socket having a slot oriented generally perpendicular to the plane for slideably receiving a corresponding tab of the motherboard, further wherein the second riser connector includes a second socket having a slot oriented generally parallel to the plane for slideably receiving a tab of the second riser card.

3. The computer assembly of claim 1 wherein the first motherboard connector includes a socket configured to removably receive a corresponding tab of the motherboard, the second riser connector includes a socket for receiving a tab of the second riser card when the first riser card is positioned beneath the second riser card, and wherein the first riser connector includes a tab for coupling to the second riser card when the second other riser card is positioned beneath the first riser card.

4. The computer assembly of claim 1, further comprising a ribbon cable having first and second opposite ends with a first ribbon connector at the first end releasably coupled to the first riser card and a second ribbon connector at the second end configured to be coupled to the second riser card.

5. The computer assembly of claim 1 wherein the first riser card has an edge generally parallel to the motherboard and the second riser connector includes an edge connector proximate to the edge of the first riser card.

6. The computer assembly of claim 1 wherein the first riser card has a first edge generally parallel to the motherboard, a second edge generally perpendicular to the motherboard and the second riser connector includes an edge connector proximate to the second edge of the first riser card.

7. The computer assembly of claim 1 wherein the first riser card defines a plane and at least one of the expansion ports faces away from the plane to receive the selected device.

8. The computer assembly of claim 1 wherein the first plurality of expansion ports intersects an axis extending between the first and second riser connectors.

9. The computer assembly of claim 1 wherein the first plurality of expansion ports is offset from an axis extending between the first and second riser connectors.

10. The computer assembly of claim 1 wherein the first coupling circuitry includes a bus coupled to the first and second riser connectors and coupled to the first plurality of expansion ports.

11. The computer assembly of claim 1, further comprising pass-through circuitry coupled to the first and second riser connectors of the first riser card and decoupled from the expansion ports of the first riser card.

12. The computer assembly of claim 1 wherein the second riser card includes pass-through circuitry connected between the third and fourth riser connectors of the second riser card for transmitting signals directly between the third and fourth connectors.

13. The computer assembly of claim 1 wherein the first motherboard connector includes a first slotted socket for receiving a tab of the second motherboard connector, the second riser connector includes a second slotted socket, and the third riser connector includes a tab removably received in the second slotted socket.

14. The computer assembly of claim 1 wherein the first plurality of expansion ports and the first and second connectors of the first riser card are arranged generally similarly to an arrangement of the second plurality of expansion ports and the third and fourth connectors of the second riser card.

15. The computer assembly of claim 1 wherein the first riser card is generally perpendicular to the motherboard and defines a riser card plane, the second riser card being coupled to the first riser card in the riser card plane.

* * * * *